(12) United States Patent
Ogata

(10) Patent No.: US 8,077,497 B2
(45) Date of Patent: Dec. 13, 2011

(54) RESISTIVE MEMORY DEVICE AND OPERATING METHOD THEREOF

(75) Inventor: Kentaro Ogata, Nagasaki (JP)

(73) Assignee: Sony Corporation, Tokyo (JP)

(\*) Notice: Subject to any disclaimer, the term of this patent is extended or adjusted under 35 U.S.C. 154(b) by 5 days.

(21) Appl. No.: 12/801,536

(22) Filed: Jun. 14, 2010

(65) Prior Publication Data

US 2011/0026300 A1 Feb. 3, 2011

(30) Foreign Application Priority Data

Jul. 29, 2009 (JP) ................................ 2009-176848

(51) Int. Cl.
*G11C 11/00* (2006.01)

(52) U.S. Cl. ............. 365/148; 365/46; 365/55; 365/74; 365/97; 365/100; 365/131; 365/158; 365/171; 365/173; 365/163

(58) Field of Classification Search .................... 365/46, 365/55, 74, 97, 100, 131, 148, 158, 171, 365/173, 163
See application file for complete search history.

(56) References Cited

U.S. PATENT DOCUMENTS

| 2006/0023497 A1* | 2/2006 | Kawazoe et al. ............. 365/158 |
| 2006/0028247 A1* | 2/2006 | Hara et al. ..................... 326/104 |
| 2006/0104106 A1* | 5/2006 | Aratani et al. ................ 365/148 |

FOREIGN PATENT DOCUMENTS

JP  2007-133930  5/2007

\* cited by examiner

*Primary Examiner* — Fernando Hidalgo
(74) *Attorney, Agent, or Firm* — Rader, Fishman & Grauer PLLC

(57) ABSTRACT

A resistive memory device includes: a storage element; a first line and a second line; a first drive controller; and a second drive controller.

7 Claims, 9 Drawing Sheets

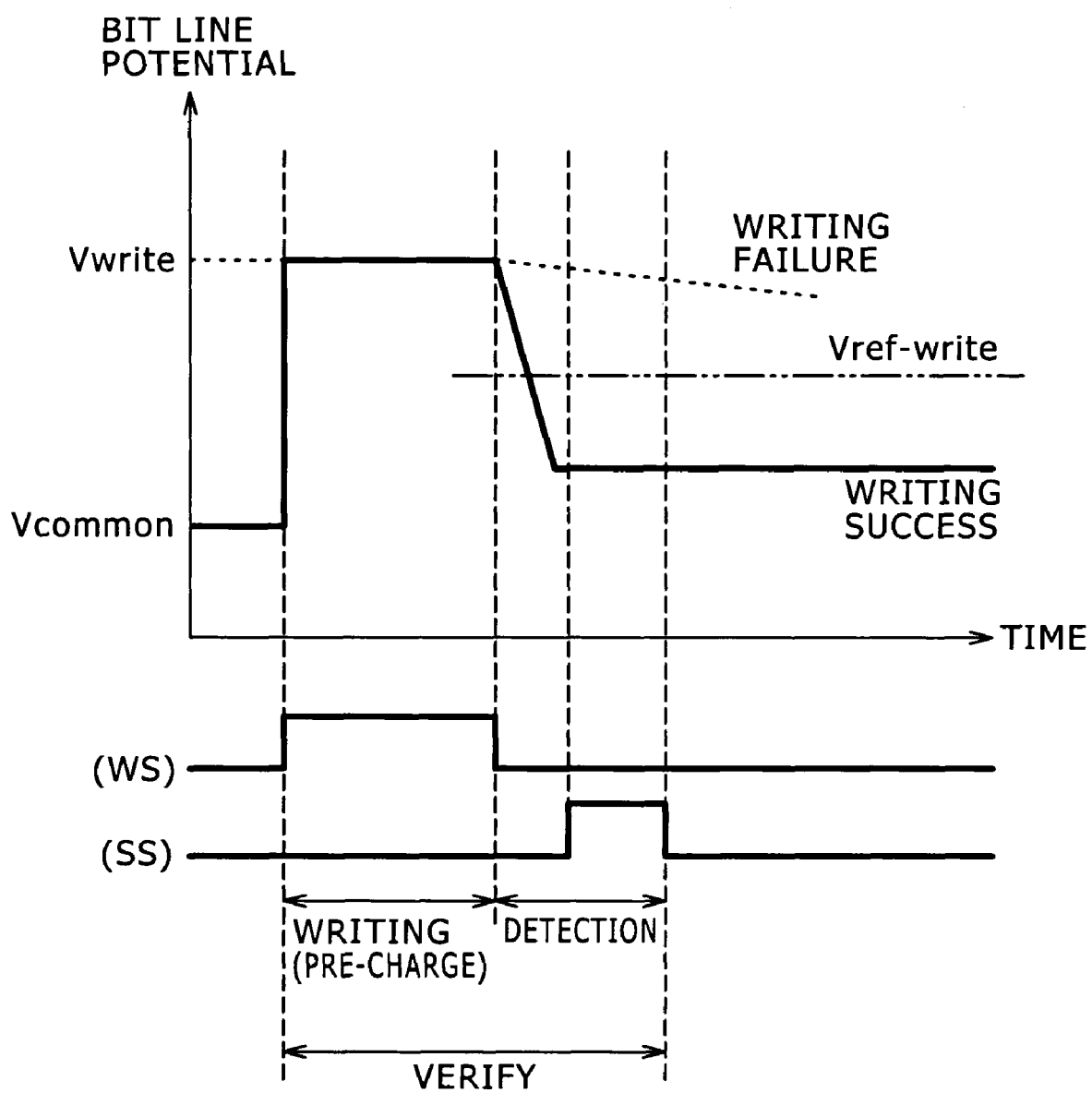

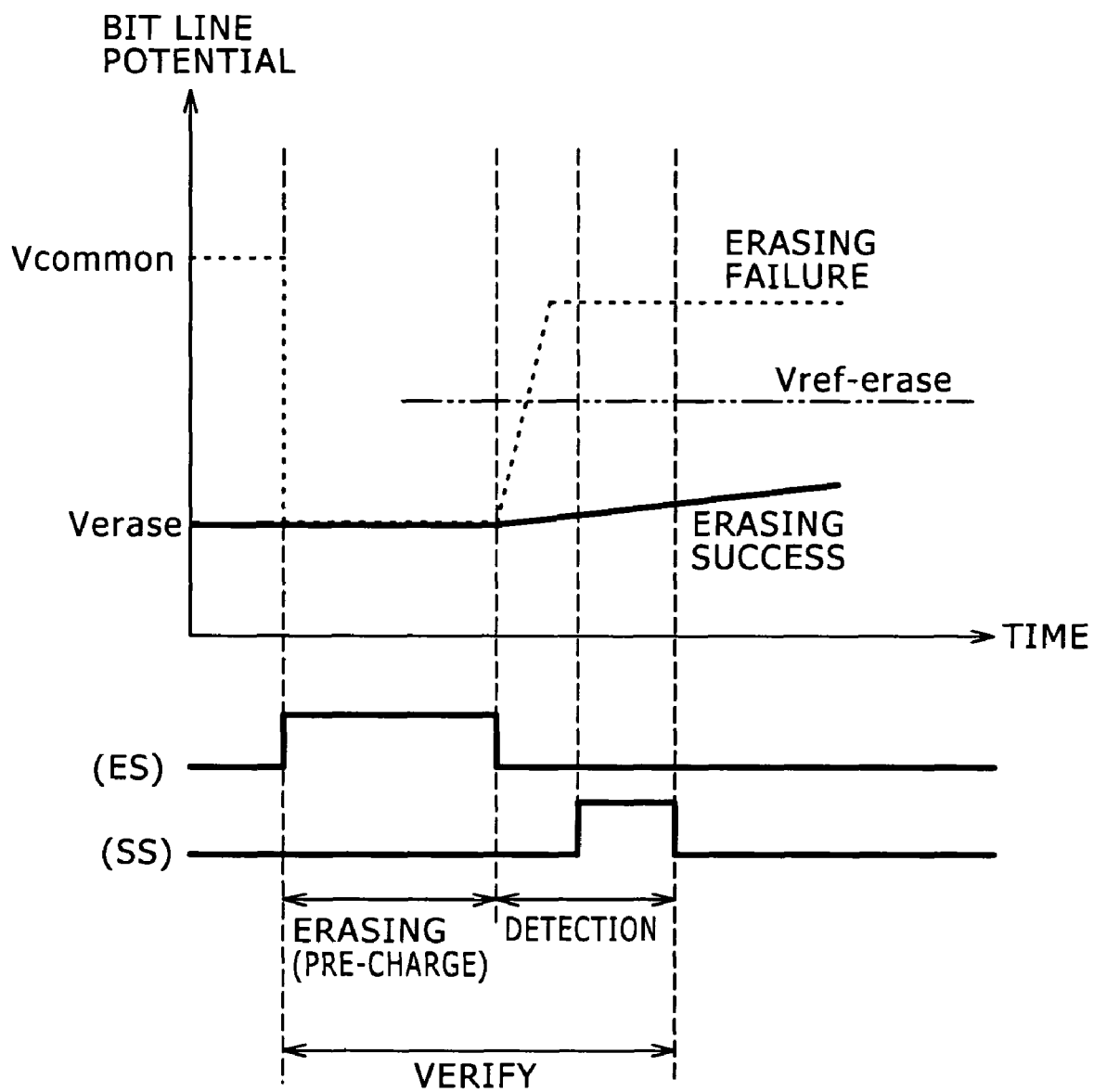

RESISTIVE MEMORY DEVICE AND OPERATING METHOD THEREOF

BACKGROUND OF THE INVENTION

1. Field of the Invention

The present invention relates to a resistive memory device having a storage element whose data storage state changes based on resistance change dependent on the application voltage, and an operating method thereof.

2. Description of the Related Art

The resistive memory device is being actively used in resent years because it does not demand the electrical power for holding stored data. The floating gate (FG) flash memory, which is mainly employed as the memory device currently, has a disadvantage of low data writing speed. In the FG flash memory, not only that the data writing speed itself is low, but also that verify operation is needed in data writing. Therefore, the total writing time is long.

For resolution of this disadvantage, there are methods in which the verify operation is improved to shorten the total writing time. As one of the methods, there has been proposed a technique in which so-called direct verify operation is applied to a resistive memory device, which has higher writing speed (refer to e.g. Japanese Patent Laid-open No. 2007-133930 (hereinafter, Patent Document 1)).

In normal verify operation, for a memory cell, the bit line is pre-charged after the end of a recording process (program), and thereafter verify readout (detection) operation is carried out. A series of operation of repeating the verify operation composed of the program and the detection until the desired resistance change is obtained is carried out. This series of operation will be referred to as the "writing verify operation" if it is for writing, and will be referred to as the "erasing verify operation" if it is for erasing. Hereinafter, the term "recording process" or "program" will refer to recording (program) of data of "1" or "0" no matter whether it is for writing (changing any storage logic from the initial state) or for erasing (returning the storage logic to the initial state).

In contrast, in the direct verify operation, after the end of a recording process, verify readout (detection) is performed by directly using the charge left in the bit line at this time to thereby shorten the total time. In the direct verify operation, the total writing operation time can be shortened corresponding to the absence of pre-charge for verify readout.

The writing verify operation described in Patent Document 1 will be described below.

FIG. 1 shows how the bit line voltage (hereinafter, referred to as the BL voltage) changes in a recording (writing) process for writing and the subsequent readout (detection) process when the writing verify operation is carried out by the method described in Patent Document 1.

The potential change of the bit line shown in FIG. 1 will be described below.

By the writing operation, the BL voltage changes from a common potential Vcommon to a writing voltage Vwrite. When the writing by this writing operation has succeeded, the resistance of the variable resistance element has become low. Thus, when the supply of the writing voltage to the bit line is stopped, the BL voltage changes to a certain sufficiently-low potential corresponding to the resistance of the variable resistance element.

On the other hand, when the writing has failed, the resistance of the variable resistance element has not become sufficiently-low but is high. Thus, the BL voltage does not much decrease although the supply of the writing voltage is stopped.

If a reference potential Vref-write for writing is set between these potentials in advance, the output dependent on whether the writing has resulted in success or failure is obtained by a sense amplifier, and thus whether the writing has been correctly performed can be checked.

FIG. 2 shows how the BL voltage changes in a recording (erasing) process for erasing and the subsequent readout (detection) process when the erasing verify operation is carried out by the method described in Patent Document 1.

In the method of the related art, the so-called pre-charge process, in which voltage is applied to the bit line BL in order to carry out the verify operation, is carried out in the erasing process, in which an erasing voltage Verase is applied to the bit line BL for erasing.

The potential change of the bit line BL dependent on the state as to the success or failure of erasing is different from the potential change in the writing verify operation.

Specifically, after the BL voltage is lowered from the common potential Vcommon to the erasing voltage Verase in the erasing process, if the erasing has succeeded, the resistance of the variable resistance element has changed to high resistance, and thus the BL voltage does not much change although the erasing signal is turned off.

If the erasing has failed, the resistance of the variable resistance element has not become sufficiently-high but is low, and therefore the BL voltage rises up to a certain potential.

If a reference potential Vref-erase for erasing is set in advance between these two potentials taken as the value of the BL voltage, the output dependent on the success or failure of the erasing is obtained by the sense amplifier. Thus, whether the erasing has been correctly performed can be checked.

By using the process in which voltage is applied to the bit line BL to perform writing or erasing for the variable resistance element in the selected cell also as the pre-charge process for the verify operation in this manner, the time demanded for the writing verify operation and erasing operation is shortened.

SUMMARY OF THE INVENTION

However, in realization of the technique described in Patent Document 1, the circuit for inhibit operation control becomes complex.

Thus, the circuit area of the sense amplifier and the bit line driver becomes large. Therefore, the area is increased if the sense amplifier and the bit line driver are arranged at the same density as that of existing memory devices.

To be more specific about the increase in the complexity of the circuit, a latch circuit for storing the inhibit status at the time of erasing operation is needed. In the inhibit operation, control to isolate the sense amplifier from the bit line BL is carried out by using the inhibit status stored in the latch circuit.

A more specific description will be made below in association with the voltage change of the bit line BL with use of FIG. 2. For a cell in which erasing has succeeded, the BL voltage needs to be set to the common potential Vcommon with the inhibit control because this cell demands no more erasing.

However, if verify detection is performed in this state, it is determined by the sense amplifier that the erasing has failed because the bit line is at the common potential Vcommon, which is higher than the reference potential Vref-erase for erasing.

As a countermeasure against this problem, the latch circuit for storing the inhibit status at the time of erasing is prepared.

If the status of the latch circuit is the inhibit status, control to turn off the switch between the bit line BL and the sense amplifier to isolate the bit line from the sense amplifier is needed. This forces the sense amplifier and the bit line driver to have large circuit area and complex circuit.

Whether writing or erasing relates to this problem is arbitrary and depends on the initial state of the storage element (variable resistance element). In general, the initial state is the high-resistance state, and therefore the problem of the increase in the complexity of the circuit occurs in the erasing inhibit control. However, it will also be possible that the latch circuit or the like for storing the inhibit status at the time of writing is needed.

The present embodiment relates to a resistive memory device that employs the above-described variable resistance element as a storage element. There is a need for the present embodiment to provide a resistive memory device including a configuration for carrying out voltage control so that it may not be determined that resistance change by writing or erasing is insufficient in readout operation subsequent to the writing or erasing although the resistance change is sufficient.

According to an embodiment of the present invention, there is provided a resistive memory device including a storage element whose data storage state changes based on resistance change dependent on an application voltage, a first line and a second line that supply the application voltage to the storage element, a first drive controller for direct verify operation, and a second drive controller.

The first drive controller controls operation of making an element current flow through the storage element by stopping voltage supply to the first line after performing writing or erasing of data for the storage element.

In the direct verify operation of one of the writing and the erasing, at a predetermined timing, the second drive controller reverses the polarity of the inter-line voltage between the first line and the second line to the polarity different from that at the time of the latest voltage supply to the first line by potential operation of one of the first line and the second line. Furthermore, in the direct verify operation of the other of the writing and the erasing, the second drive controller does not carry out the polarity reversal of the inter-line voltage. The predetermined timing refers to a timing before the stop of the voltage supply to the first line by the first drive controller, or a timing since the end of the discharge period of the first line by the element current.

At the former predetermined timing, i.e. a timing before the stop of the voltage supply to the first line by the first drive controller, a current needs to be made to flow through the storage element by the voltage of the first line (corresponding to the bit line in the above-described example) at this time.

Suppose that the first line is the bit line and the second line is the plate line. Furthermore, suppose that the potential of the first line (BL potential) is controlled with the potential of the second line used as the basis potential in the case of erasing for example.

In the case of the polarity reversal of the inter-line voltage in this case, verify readout needs to be performed with the BL potential after the polarity reversal. Therefore, voltage difference for the readout needs to be ensured between the BL voltage after the polarity reversal and the voltage of the plate line as the second line. However, the direction of the voltage may be any. Thus, for example if the basis potential of the bit line voltage for writing and erasing is the plate line potential, the polarity reversal is carried out by decreasing the bit line voltage to a potential that is so lower than the basis potential that the readout voltage can be ensured. In general, the basis potential is lower than the reference potential of the sense amplifier. Thus, erroneous determination by the sense amplifier does not occur if the bit line voltage is set lower than the basis potential.

For description of the latter predetermined timing, i.e. a timing since the end of the discharge of the first line by the element current, suppose that the initial state of the storage element is the high-resistance state and erasing is performed for example. In this case, when the erasing has succeeded, the resistance of the storage element has become sufficiently-high, and thus the lowering of the bit line potential by the discharge is slight. Therefore, the bit line potential after the discharge does not become lower than the reference potential of the sense amplifier. After the activation of the sense amplifier, the bit line potential rises up due to charge supply from the positive power supply of the sense amplifier. Thus, erroneous determination by the sense amplifier does not occur. The polarity reversal of the inter-line voltage in this case can be carried out by operating the potential of the second line (the plate line in the above-described example) at the time of the activation of the sense amplifier for example.

Such polarity reversal of the inter-line voltage is effective when being carried out in one of writing and erasing. If it is carried out in both of them, one of them results in potential change that easily causes erroneous determination.

The embodiment of the present invention can provide a resistive memory device including a configuration for carrying out voltage control so that it may not be determined that resistance change by writing or erasing is insufficient in readout operation subsequent to the writing or erasing although the resistance change is sufficient.

BRIEF DESCRIPTION OF THE DRAWINGS

FIG. 1 is a waveform diagram of bit line potential change in writing verify operation to which a system of a related art is applied;

FIG. 2 is a waveform diagram of bit line potential change in erasing verify operation to which the system of the related art is applied;

DETAILED DESCRIPTION OF THE PREFERRED EMBODIMENTS

Embodiments of the present invention will be described below in the following order with reference to the drawings.

1. First Embodiment: embodiment relating to the polarity reversal operation for the voltage between BL and PL before stop of supply of the BL potential (including modification example 1).
2. Second Embodiment: embodiment relating to the polarity reversal operation for the voltage between BL and PL since the end timing of BL discharge.
3. Other Modification Examples

1. First Embodiment

A first embodiment of the present invention relates to a resistive memory device employing a variable resistance element as a storage element.

[Configuration of Storage Element]

Figure 3A:
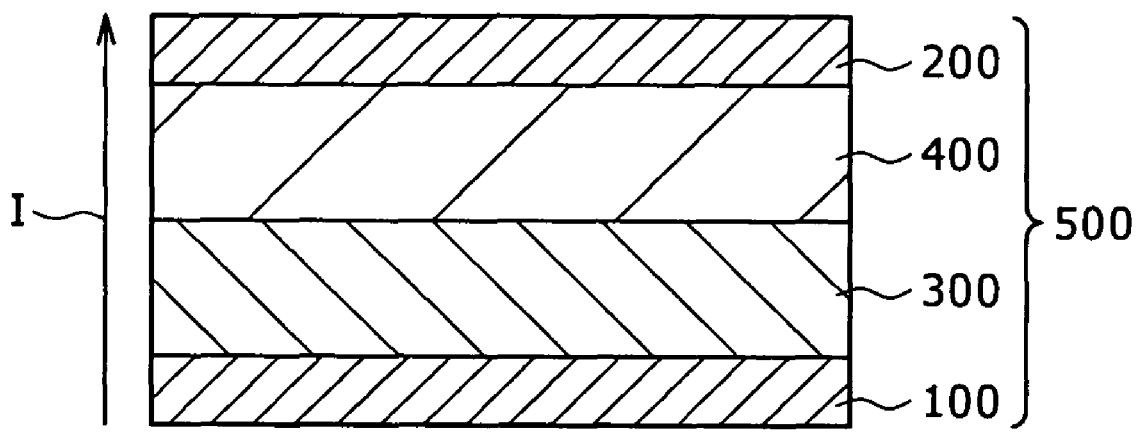
FIGS. 3A and 3B are a sectional structural diagram and a circuit symbol diagram of a variable resistance element.

FIG. 3A is a schematic sectional view showing one form of the variable resistance element.

A variable resistance element (VRE) 500 illustrated in FIG. 3A is based on a film configuration having a conductor film 300 and an insulator film 400 between two electrodes 100 and 200.

Figure 3B:
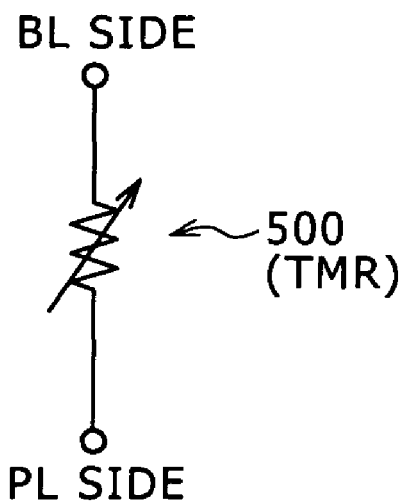

In FIG. 3B, a circuit symbol of the variable resistance element (VRE) 500 as the "storage element" is shown.

That the direction of the arrowhead in the circuit symbol shown in FIG. 3B is the upward direction corresponds to that the direction of a current I in FIG. 3A is the upward direction. The direction of the arrowhead in this circuit symbol generally represents the direction of the current at the time of setting (writing).

The operation principle of the variable resistance element will be simply described below with use of FIGS. 3A and 3B.

When voltage is so applied between the electrodes 100 and 200 that the electrode 200 closer to the insulator film 400 is at the lower potential, metal element ions (positive metal ions) in the conductor film 300 are attracted toward the electrode 200 to enter the insulator film 400. When the positive metal ions reach the electrode 200, electrical conduction is established between the upper and lower electrodes 100 and 200, so that the resistance is lowered. In this manner, writing of data (information) to the variable resistance element (VRE) 500 is performed.

On the other hand, when voltage is so applied between the electrodes 100 and 200 that the electrode 100 closer to the conductor film 300 is at the lower potential, the positive metal ions are attracted toward the electrode 100 to get out from the insulator film 400. Thus, the degree of insulation between the upper and lower electrodes 100 and 200 increases and the resistance rises up. In this manner, erasing of data (information) is performed for the variable resistance element (VRE) 500.

Through the repetition of the above-described change, the resistance of the variable resistance element (VRE) 500 can be reversibly changed between the high-resistance state and the low-resistance state.

FIGS. 3A and 3B show film structures similar to that described in Patent Document 1. However, recently, the film structure obtained by reversing the vertical positions of the conductor film 300 and the insulator film 400 is becoming mainstream. In many cases, a bit line BL serving as the "first line" is disposed above the variable resistance element (VRE) 500, and the electrode 100 is connected to a plate line PL serving as the "second line." Therefore, the circuit operation in the present specification will also be premised on the element structure in which the relationship between the conductor film 300 and the insulator film 400 is opposite to that of FIG. 3A.

Specifically, in the element structure used for the description of the present specification, the conductor film 300 serving as the supply source of the positive metal ions is closer to the bit line BL. Thus, to enhance the conductivity of the insulator film 400 by the movement of positive metal ions (this operation direction corresponds to writing), such polarity of the inter-line voltage (writing voltage) that the bit line BL serves as the positive electrode and the plate line PL serves as the negative electrode is employed. In contrast, as the inter-line voltage corresponding to erasing (erasing voltage), such a voltage that the bit line BL serves as the negative electrode and the plate line PL serves as the positive electrode is applied.

[Circuit Block Configuration of Memory Device]

Figure 4:
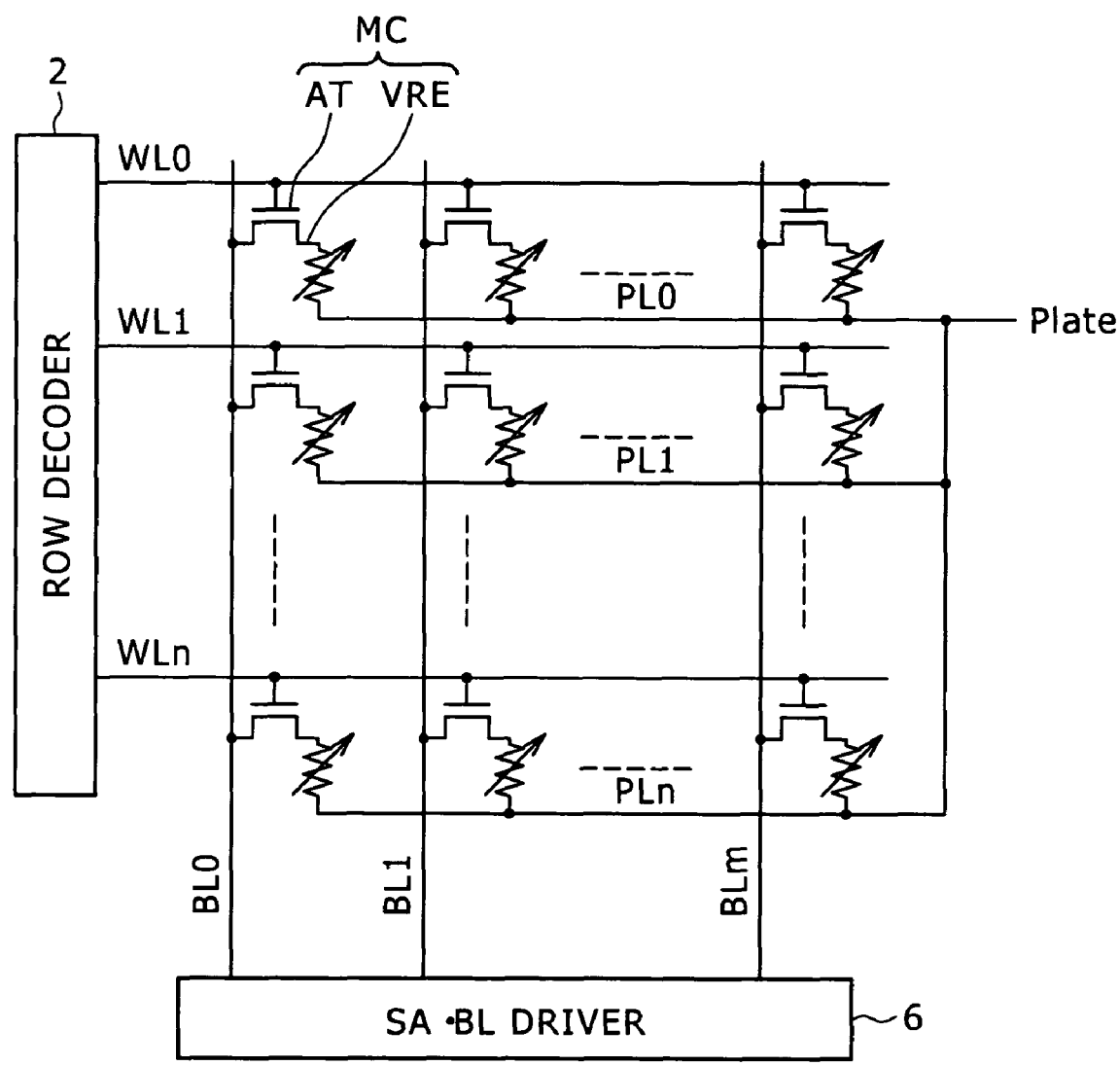
FIG. 4 is a circuit block diagram of a device relating to a first embodiment of the present invention.

FIG. 4 shows a configuration example of a memory cell array and a peripheral circuit thereof.

A memory cell MC is composed of a pair of the variable resistance element (hereinafter, represented as VRE) and an access transistor AT.

One terminal of the variable resistance element VRE is connected to the source of the access transistor AT, and the other terminal thereof is connected to the plate line PL. The plate line PL is a common line that is common to the memory cell array.

The memory cell array 1 has a row decoder 2 on the gate side of the access transistor AT, and carries out row selection of the memory cell MC.

An SA•BL driver 6 is provided on the drain side of the access transistor AT. The SA•BL driver 6 connects the bit line BL to the power supply corresponding to writing, erasing, or readout. The power supply and the sense amplifier in the SA•BL driver 6 are disposed for each bit line ideally, and the SA•BL driver 6 performs writing, erasing, or readout by all of the bit lines in parallel.

The verify method described in Patent Document 1 involves a problem that the circuit becomes complex and large due to the inhibit operation control.

Therefore, it is impossible to dispose the power supply and the sense amplifier in the SA•BL driver 6 for each bit line without increase in the area.

For example, as for the sense amplifier, if avoidance of the increase in the circuit area is attempted, a connection form is employed in which two bit lines BL are connected to one sense amplifier SA (1SA/2BL connection) or four bit lines BL are connected to one sense amplifier SA (1SA/4BL connection). In this case, the number of sense amplifiers in the SA•BL driver 6 decreases.

Therefore, the number of lines operated in parallel for writing, erasing, and readout also decreases. As a result, the operation speed of the memory device is lowered.

In the present embodiment, the following configuration and operation are realized for solving these problems and preventing the increase in the complexity of the inhibit control circuit.

[Configuration of Drive Circuit]

Figure 5:
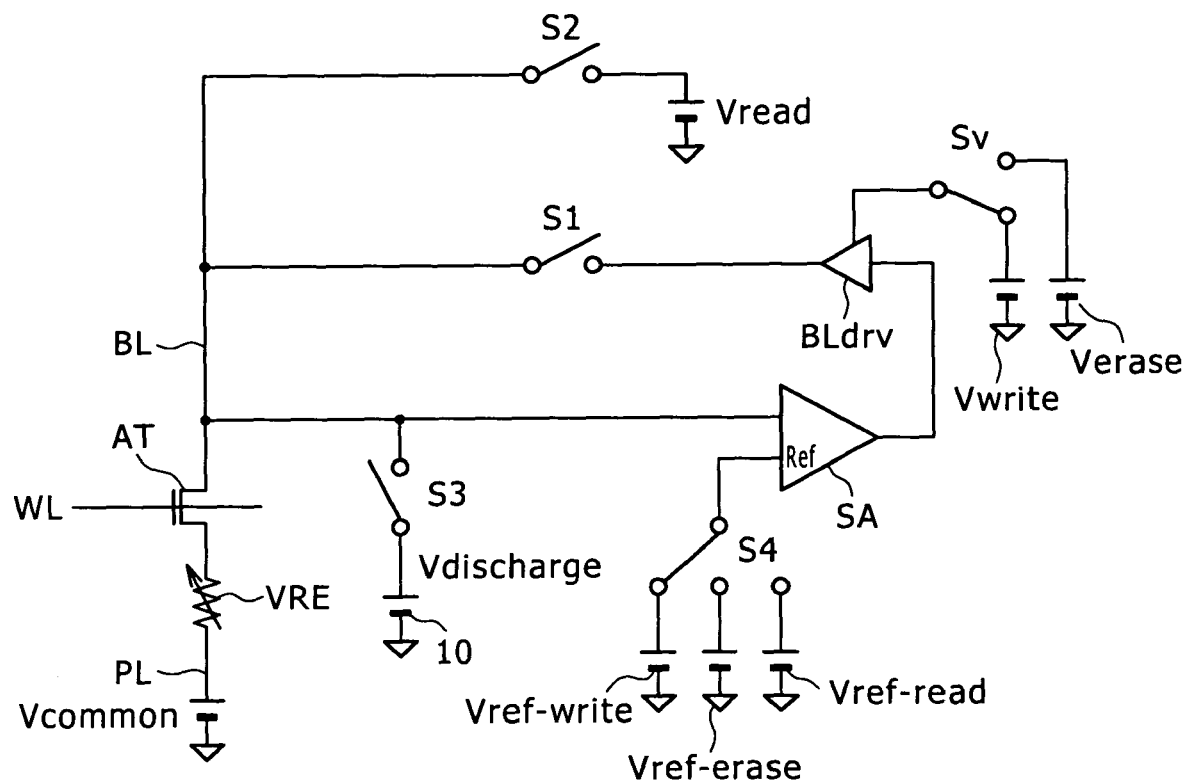
FIG. 5 is a drive circuit diagram relating to the first embodiment.

FIG. 5 shows a configuration example of a drive circuit relating to writing, erasing, and readout operation in the memory device according to the present embodiment.

As shown in FIG. 5, the plate line PL and the access transistor AT are connected to the variable resistance element VRE in a selection cell, and a selection word line WL is connected to the gate of the access transistor AT.

Switches S1 and S2 are connected to the bit line BL, and a BL driver BLdrv is connected to the switch S1. The power supply for the BL driver BLdrv can be switched by a switch Sv.

By these switches S1, S2, and Sv, the voltage applied to the bit line BL is switched to any of a writing voltage Vwrite, an erasing voltage Verase, and a readout voltage Vread.

A sense amplifier SA is connected to the bit line BL. A switch S3 is connected to the bit line BL, and a discharge power supply 10 is connected to the switch S3. The switch S3 is set to the on-state for only an instantaneous period between erasing (serving also as pre-charge) and detection in erasing operation. The switch S3 and the discharge power supply 10 are equivalent to a configuration example of the "discharge part" of the present embodiment.

The circuit of FIG. 5 has a configuration in which the sense amplifier SA differentially amplifies the input potential with respect to the reference potential. A power supply for providing the reference potential is connected to the sense amplifier SA via a switch S4.

Three power supplies are provided as the power supply for providing the reference potential, and provide a writing reference potential Vref-write used in writing verify operation, an erasing reference potential Vref-erase used in erasing operation, and a readout reference potential Vref-read used in readout operation, respectively.

[Operation of Drive Circuit]

The circuit operation will be described below.

However, because the writing operation and the readout operation are the same as those in the related-art technique, only the writing verify will be simply described, and the erasing operation (erasing process and erasing verify operation) will be described in detail.

In the writing verify operation, the switch Sv in FIG. 5 is switched to, of two power supplies, the power supply for generating the writing voltage Vwrite. Furthermore, the switch S1 is turned on or off by a writing signal. The switch S3 is not operated in the writing verify operation.

So-called pre-charge of applying voltage to the bit line BL in order to carry out the writing verify operation is not performed, but the bit line voltage at the end timing of the writing process is directly used instead of the pre-charge voltage.

In the writing process, a predetermined voltage is applied to the bit line BL because the switch S1 is turned on by the writing signal. Simultaneously with the end of the writing process, the switch S1 is turned off and thus the voltage-applied state of the bit line BL is stopped, so that it moves into the high-impedance state (floating state).

At this time, a current flows through the variable resistance element VRE, and the bit line voltage rises up depending on the amount of current. After the end of a charge period that is estimated to be long enough to sufficiently charge the bit line BL by the current is waited, the sense amplifier SA is activated by an SA enable signal. The sense amplifier SA detects the magnitude of the BL potential on the basis of the reference potential Vref-write for writing, selected by the switch S4 in advance, and outputs an output data signal generated by amplifying the detection result to the supply voltage level.

In the erasing operation, the switch Sv in FIG. 5 is switched to, of two power supplies, the power supply for providing the erasing voltage Verase. Furthermore, the switch S1 is turned on or off by an erasing signal. The switch S4 is connected to the power supply for providing the reference voltage Vref-erase for erasing.

Figure 6:
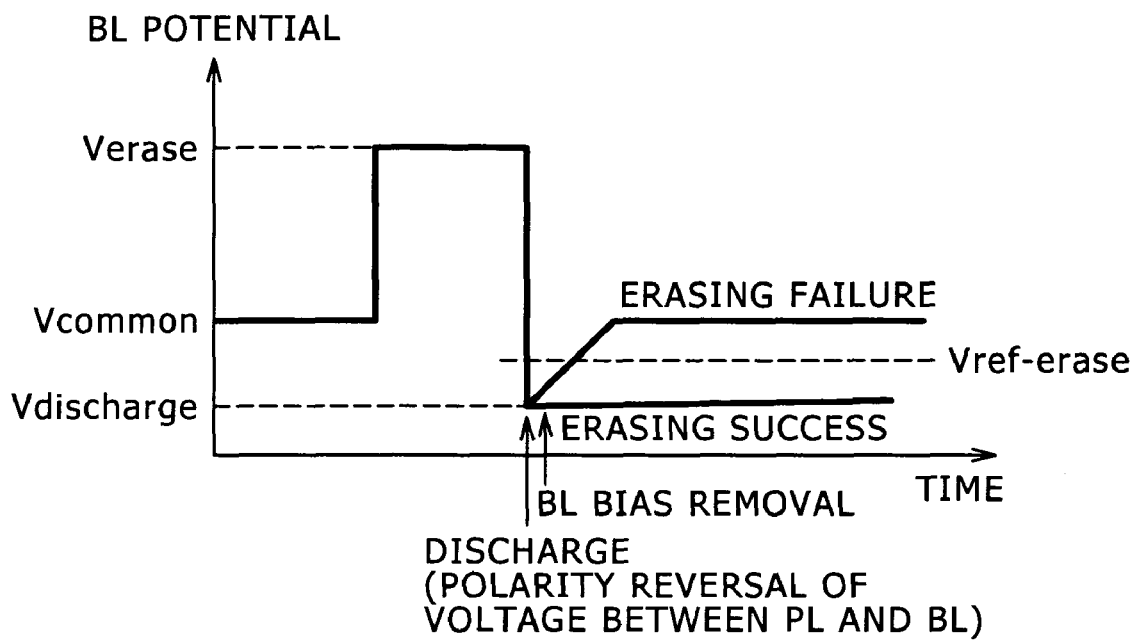
FIG. 6 is a waveform diagram of bit line potential change in erasing verify operation, showing an operating method relating to the first embodiment.

FIG. 6 shows the potential change of the bit line BL in the erasing verify operation in this circuit state, i.e. in the erasing process and the detection process (verify readout operation).

First, by erasing (serving also as pre-charge) operation, the BL potential changes from the common potential Vcommon to the erasing voltage Verase at the higher level.

Thereafter, the application of the erasing voltage Verase to the bit line BL is turned off by the switch S1 in FIG. 5, and the switch S3 is turned on to discharge the bit line BL to the discharge potential Vdischarge. Thereafter, immediately the BL bias is removed and the verify readout operation is carried out with the potential difference between the BL potential (discharge potential Vdischarge) and the PL potential (common potential Vcommon).

The operation of changing the BL potential to the discharge potential Vdischarge lower than the common potential Vcommon is equivalent to the "polarity reversal of the inter-line voltage (voltage between BL and PL)" of the present embodiment.

Specifically, because the plate line PL is fixed to the common potential Vcommon as shown in FIG. 5, such an inter-line voltage that the BL side serves as the positive electrode and the PL side serves as the negative electrode is applied before the discharge, whereas after this discharge, the BL side becomes the negative electrode and the PL side becomes the positive electrode, i.e. polarity reversal occurs.

If the erasing has succeeded, the resistance of the variable resistance element VRE has become high, and thus the bit line BL is kept at a potential lower than the reference voltage Vref-erase after being discharged to the discharge potential Vdischarge lower than the common potential Vcommon.

On the other hand, if the erasing has failed, the resistance of the variable resistance element VRE has not become sufficiently-high but is low. Therefore, although the bit line BL is discharged to the discharge potential Vdischarge lower than the common potential Vcommon by turning off the switch S1 in FIG. 5 and turning on the switch S3, the BL potential is immediately charged to the common potential Vcommon.

If the reference potential Vref-erase for erasing is set in advance between these two BL potentials generated in the case of the erasing success and the erasing failure, respectively, the output dependent on the success or failure of the erasing is obtained by the sense amplifier SA. Thus, whether the erasing has been correctly performed can be checked.

If this verify system is employed, also for the memory cell MC in the inhibit state (memory cell MC whose bit line is at the common potential Vcommon during erasing), the bit line BL is discharged to the discharge potential Vdischarge and thereafter the BL bias is removed to perform verify readout with the potential difference between the BL potential (discharge potential Vdischarge) and the PL potential (common potential Vcommon). Thus, also from the memory cell MC in the inhibit state, the same verify readout result as that from the memory cell MC for which the erasing has succeeded is obtained. Therefore, the logic matching circuit for the inhibit control is unnecessary.

In the writing verify operation described first, the switch S3 is not operated. This is because of the following reason. Writing is different from erasing in that the success in the writing results in the low-resistance state. Therefore, if the discharge is carried out by the switch S3, the potential rises up from that of the bit information of the writing success, and thus the possibility of erroneous readout becomes higher.

As just described, in the present embodiment, the discharge part (the switch S3 and the discharge power supply 10) carries out potential operation of the bit line BL in one of writing and erasing (in the present example, erasing), to thereby carry out the polarity reversal of the inter-line voltage (voltage between PL and BL). In the other of writing and erasing, such polarity reversal of the inter-line voltage is not carried out.

Modification Example 1

Figure 7:
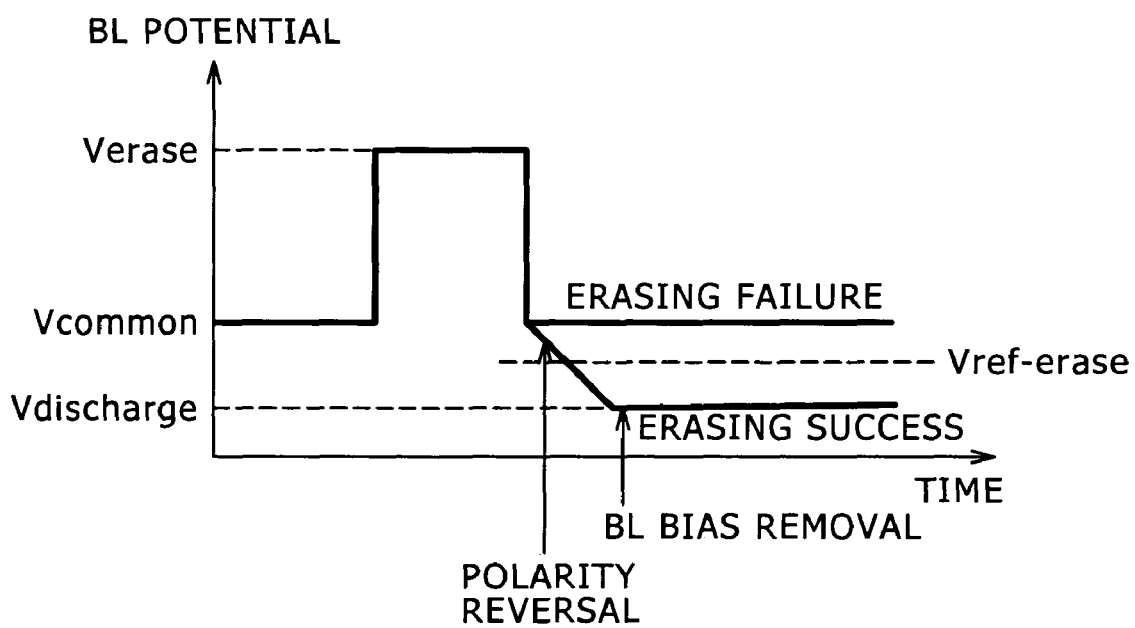
FIG. 7 is a waveform diagram of bit line potential change, showing a modification example of the operating method relating to the first embodiment.

As another form of the verify method, operation like that shown in FIG. 7 will also be available.

Referring to FIG. 7, the BL potential changes from the common potential Vcommon to the erasing voltage Verase by erasing (serving also as pre-charge) operation.

Thereafter, the switch S1 is turned off, and then the bit line BL is discharged to the common potential Vcommon via a discharge path. Examples of the configuration for forming the discharge path include a configuration in which the output of the BL driver BLdrv in FIG. 5 is connected to the common voltage Vcommon when the activation of the BL driver BLdrv is stopped.

Thereafter, the switch S3 is turned on to discharge the bit line BL to the discharge potential Vdischarge. However, the discharge via the switch S3 is performed with a certain constant current. Therefore, if the discharge of the bit line BL to the discharge potential Vdischarge is attempted, the potential of the bit line BL changes to the potential dependent on the resistance of the variable resistance element VRE.

Specifically, if the erasing has failed and thus the resistance of the variable resistance element VRE is low, although the discharge is performed by the switch S3, the lost charge is supplemented via the variable resistance element VRE having the low resistance. Thus, if this charge supply balances the charge disappearance, the BL potential becomes a certain potential higher than the reference voltage Vref-erase.

In contrast, if the erasing has succeeded and thus the resistance of the variable resistance element VRE is high, the charge supply path is almost closed, and therefore the BL potential changes to a certain potential lower than the reference voltage Vref-erase.

If the reference potential Vref-erase for erasing is set between these potentials in advance, the output dependent on the success or failure of the erasing is obtained by the sense amplifier SA, and thus whether the erasing has been correctly performed can be checked.

If this verify system is employed, also for the memory cell MC in the inhibit state (memory cell MC whose BL voltage is the common potential Vcommon during erasing), the verify readout is performed with discharge to the discharge potential Vdischarge. Thus, also from the memory cell MC in the inhibit state, the same verify readout result as that from the memory cell MC for which the erasing has succeeded is obtained. Therefore, the logic matching circuit for the inhibit control is unnecessary.

In the operation of FIG. 7, if the BL potential becomes lower than the common potential Vcommon due to the discharge via the switch S3 with a constant current after the equalization of the BL potential with the common potential Vcommon, polarity reversal occurs at this timing. This discharge of the BL potential serves also as the BL discharge in the verify readout. Thereafter, when the switch S3 is closed, the charge/discharge path for the bit line BL entirely disappears, and the application of the bit line voltage is stopped at this timing. That is, also in this case, the polarity reversal of the voltage between the first and second lines (voltage between BL and PL) is carried out before the removal of the BL bias.

2. Second Embodiment

As a second embodiment of the present invention, an example will be shown in which, in one of writing and erasing (in this example, erasing), polarity reversal of the inter-line voltage similar to the polarity reversal of the first embodiment is carried out by potential operation from the side of the plate line PL.

[Circuit Block Configuration of Memory Device]

Figure 8:
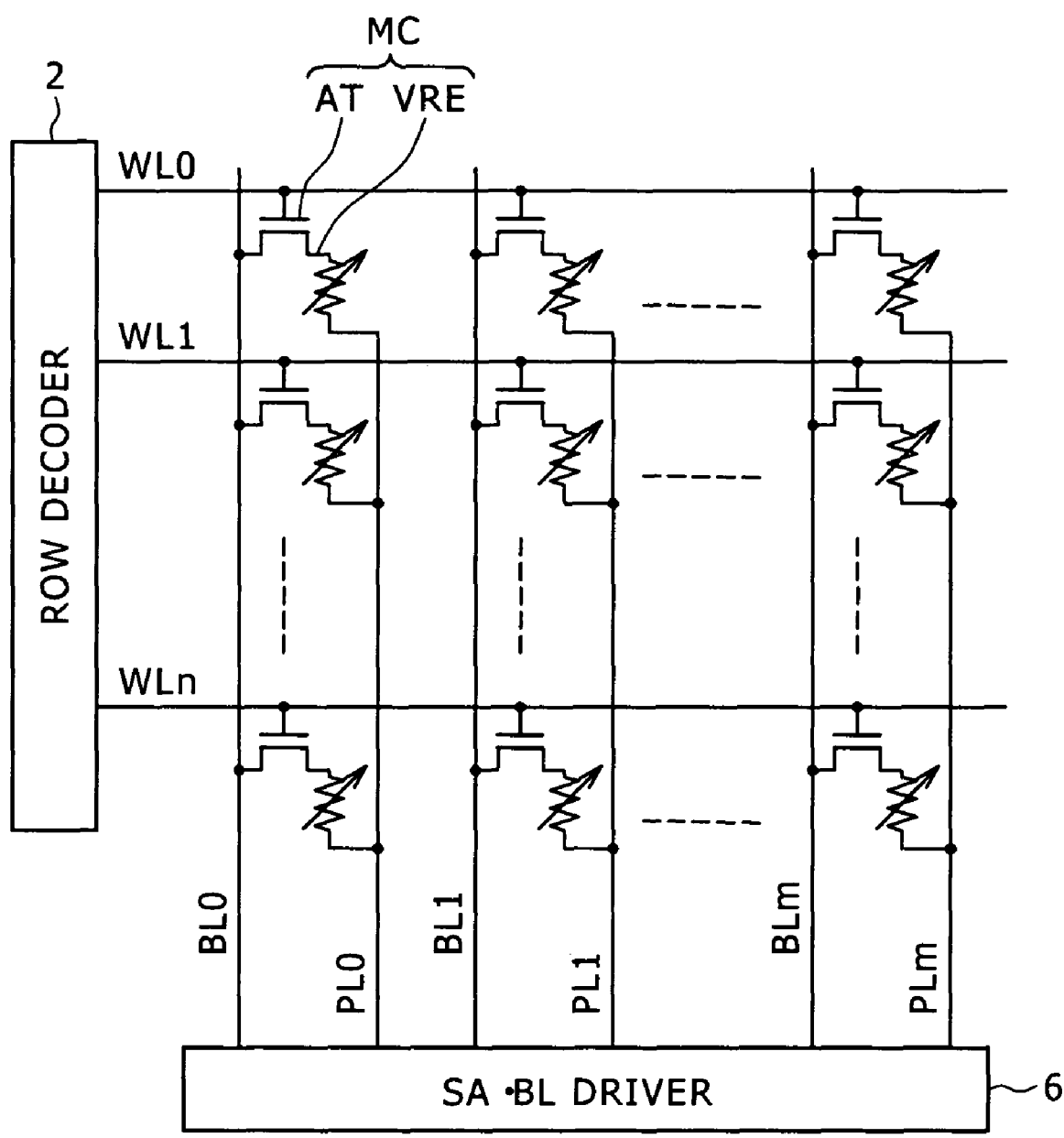
FIG. 8 is a circuit block diagram of a device relating to a second embodiment of the present invention.

FIG. 8 is a circuit block diagram showing a configuration example of a memory cell array 1 for carrying out this verify system.

In this configuration, one terminal of the variable resistance element VRE is connected to the source of the access transistor AT, and the other terminal thereof is connected to the plate line PL.

In the configuration of FIG. 4, the plate line PL is a common line that is common to the memory cell array 1. In contrast, in the configuration of FIG. 8, the plate line PL forms a pair with a respective one of the bit lines and the potential thereof can be independently controlled. In the diagram, the respective plate lines are represented as (PL0, PL1, ..., PLm). The other configuration is the same as that of FIG. 4.

[Configuration of Drive Circuit]

Figure 9:
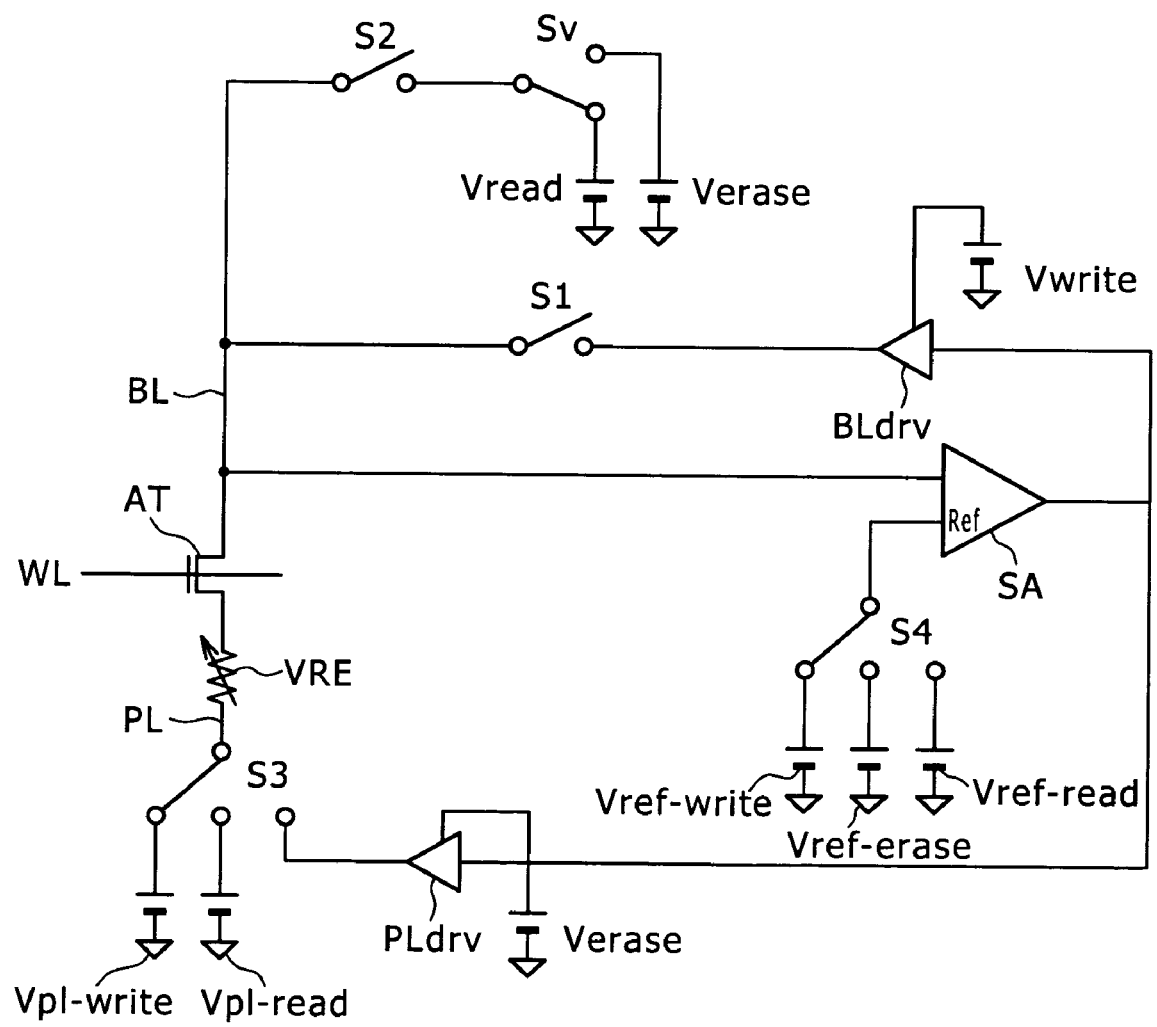
FIG. 9 is a drive circuit diagram relating to the second embodiment.

FIG. 9 shows a configuration example of a drive circuit relating to writing, erasing, and readout operation in the memory device according to the present embodiment.

As shown in FIG. 9, the plate line PL and the access transistor AT are connected to the variable resistance element VRE in a selection cell, and the selection word line WL is connected to the gate of the access transistor AT.

Switches S1 and S2 are connected to the bit line BL, and a BL driver BLdrv for controlling application of a power supply Vwrite is connected to the switch S1. Switching between a readout voltage Vread and an erasing voltage Verase can be performed by a switch Sv connected to the switch S2.

By these switches S1, S2, and Sv, the voltage applied to the bit line BL is switched to any of the writing voltage Vwrite, the erasing voltage Verase, and the readout voltage Vread.

A sense amplifier SA is connected to the bit line BL. The switch S3 is used for switching of the voltage applied to the plate line PL.

The switching contact of the switch S3 enables control of connection to a plate voltage Vpl-write at the time of writing, a plate voltage Vpl-read at the time of readout, and a PL driver PLdrv.

The PL driver PLdrv is turned on or off by e.g. an SA enable signal SAen, or a control signal given after the SA enable signal SAen by the time the sense amplifier SA starts sensing next. The PL driver PLdrv is a switch that can supply the erasing voltage Verase to the plate line PL via the switch S3 when being in the on-state, and can supply the common voltage Vcommon to the plate line PL via the switch S3 when being in the off-state.

The circuit of FIG. 9 has a configuration in which the sense amplifier SA differentially amplifies the input potential with respect to the reference potential. The power supply for providing the reference potential is connected to the sense amplifier SA via a switch S4.

Three power supplies are provided as the power supply for providing the reference potential, and provide a writing reference potential Vref-write used in writing verify operation, an erasing reference potential Vref-erase used in erasing operation, and a readout reference potential Vref-read used in readout operation, respectively.

[Operation of Drive Circuit]

The circuit operation will be described below.

However, because the writing operation and the readout operation are the same as those in the related-art technique, only the writing verify will be simply described, and the erasing operation (erasing process and erasing verify operation) will be described in detail.

In the writing verify operation, the BL driver BLdrv of FIG. 9 is so controlled as to be in the state of transmitting the writing voltage Vwrite from the power supply for generating the writing voltage Vwrite to the bit line BL. Furthermore, the switch S1 is turned on or off by a writing signal. In the writing verify operation, the switch S2 and the PL driver PLdrv are not turned on. However, the switch S3 is switched to the state of supplying the plate voltage Vpl-write for writing, and thus this plate voltage Vpl-write is applied to the plate line PL.

So-called pre-charge of applying voltage to the bit line BL in order to carry out the writing verify operation is not performed, but the bit line voltage at the end timing of the writing process is directly used instead of the pre-charge voltage.

In the writing process, a predetermined voltage is applied to the bit line BL because the switch S1 is turned on by the writing signal. Simultaneously with the end of the writing process, the switch S1 is turned off and thus the voltage-applied state of the bit line BL is stopped, so that it moves into the high-impedance state (floating state).

At this time, a current flows through the variable resistance element VRE, and the bit line voltage rises up depending on the amount of current. After the end of a charge period that is estimated to be long enough for discharge by the current is waited, the sense amplifier SA is activated by the SA enable signal. The sense amplifier SA detects the magnitude of the BL potential on the basis of the writing reference potential Vref-write selected by the switch S4 in advance, and outputs an output data signal generated by amplifying the detection result to the supply voltage level.

In the erasing operation, the switch Sv shown in FIG. 9 is switched to, of two power supplies connected thereto, the power supply for providing the erasing voltage Verase. Furthermore, the switch S2 is turned on or off by an erasing signal. The switch S4 is connected to the power supply for providing the reference voltage Vref-erase for erasing.

Figure 10A:
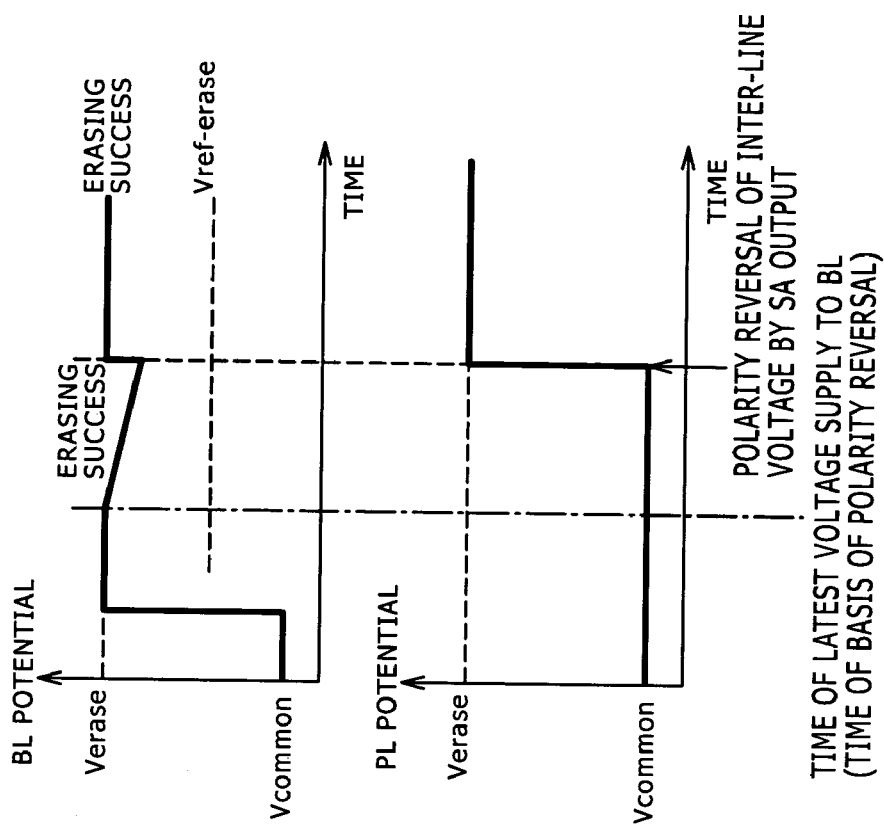
FIGS. 10A and 10B are waveform diagrams of bit line potential changes and plate line potential changes in erasing verify operation, showing an operating method relating to the second embodiment.
Figure 10B:
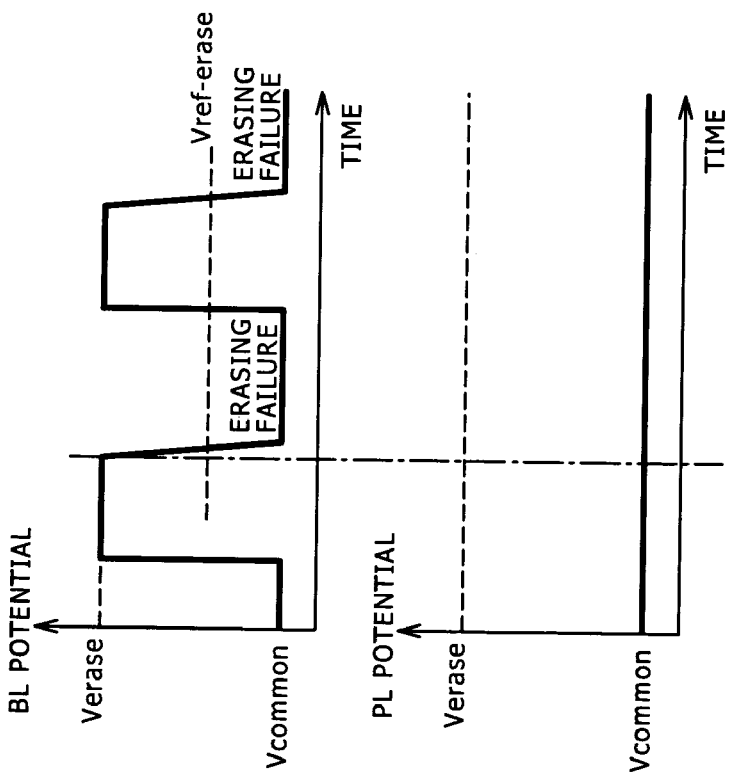

FIGS. 10A and 10B show the potential change of the bit line BL in the erasing verify operation in this circuit state, i.e. in the erasing process and the detection process (verify readout operation). FIG. 10A shows the BL potential change and the PL potential change relating to the memory cell MC in which erasing fails successively. FIG. 10B shows the BL potential change and the PL potential change when erasing succeeds and subsequently the sense amplifier SA is activated.

Referring to FIG. 10A and FIG. 10B, first, the BL potential changes from the common potential Vcommon to the erasing voltage Verase by erasing (serving also as pre-charge) operation. This is achieved by the following operation in the configuration of FIG. 9. The inactive BL driver BLdrv outputting the common potential Vcommon is turned from the state of being connected to the bit line BL via the switch S1 in the on-state to the state of being isolated from the bit line BL by turning off the switch S1. Furthermore, the switch S2 is turned on in the state in which the erasing voltage Verase is selected by the switch Sv.

When the erasing by the erasing voltage has failed, the resistance of the variable resistance element VRE has not become sufficiently-high but is low. Therefore, when the switch S2 in FIG. 9 is turned off to stop the supply of the erasing voltage Verase to the bit line BL, the bit line BL is discharged to the common potential Vcommon (FIG. 10A).

This series of operation is repeated until the resistance of the variable resistance element VRE becomes sufficiently-high.

On the other hand, when the erasing is sufficient as shown in FIG. 10B, the resistance of the variable resistance element VRE becomes high. Thus, when the switch S2 is turned off to stop the supply of the erasing voltage Verase to the bit line BL, the BL potential somewhat decreases. However, the level of the BL potential resulting from the decrease is higher than the reference voltage Vref-erase. The SA enable signal SAen is supplied in this state, so that the sense amplifier SA is activated. Therefore, the BL potential rises up to the erasing voltage Verase again due to charge supply from the positive power supply of the sense amplifier SA, and thereby erasing success is achieved. The PL driver PLdrv is turned on by data of the sense amplifier SA indicating the erasing success, and thus the PL potential rises up from the common potential Vcommon to the erasing voltage Verase as shown in FIG. 10B.

If the reference potential Vref-erase for erasing is set in advance between the BL potential corresponding to the low level obtained when erasing has failed and the BL potential corresponding to the high level obtained when erasing has succeeded, the output dependent on the success or failure of erasing is obtained by the sense amplifier SA. Thereby, whether the erasing has been correctly performed can be checked.

The configuration of the drive controller for this memory cell array is such that inhibit control at the time of erasing operation is carried out not by control of the potential of the bit line side but by setting the potential of the PL line side to Verase from the common potential Vcommon (FIG. 10B). If such inhibit control is carried out, verify readout is carried out with the BL potential set to the erasing voltage Verase also for the memory cell MC in the inhibit state. Thus, also from the memory cell MC in the inhibit state, the same verify readout result as that from the memory cell MC for which the erasing has succeeded is obtained. Therefore, the logic matching circuit for the inhibit control is unnecessary.

According to the embodiment of the present invention, inhibit operation control can be realized with a simple circuit configuration, and increase in the circuit area of the SA•BL driver 6 can be eliminated. Thus, without increase in the area of the memory device, the number of power supplies and sense amplifiers in the SA•BL driver 6 can be increased and thus the number of lines operated in parallel can also be increased, so that increase in the speed of the memory device can be realized.

3. Modification Example 2

As described above, for the first embodiment, the example is shown in which inhibit control is carried out by reversing the polarity of the inter-line voltage between the bit line BL and the plate line PL by potential operation from the BL side.

The first embodiment is an example of the case in which the timing of the polarity reversal is "before and at the stop of the voltage supply to the first line (in this example, BL)." In the example of FIG. 6, after the discharge, the voltage supply is stopped to perform cell current discharge. Therefore, the action of the discharge before the cell current discharge is equivalent to polarity reversal operation. As for the basis of the reversal, i.e. the timing at which the inter-line voltage as the subject of the reversal is supplied, "the polarity is reversed to the polarity different from that at the time of the latest voltage supply to the first line" in the present embodiment. Therefore, the timing immediately before the discharge is the basis of the reversal.

On the other hand, in the second embodiment, after the SA enable signal SAen is activated, the polarity reversal of the inter-line voltage is carried out from the side of the plate line PL. However, because "since the end of the discharge period of the first line by an element current" is the requirement, the activation of the SA enable signal SAen exactly triggers this end timing. Therefore, in the second embodiment, the timing of the polarity reversal is not limited to the timing of the SA activation, but it is also possible to carry out the polarity reversal after the SA activation. For example, the polarity reversal of the inter-line voltage (voltage between BL and PL) may be carried out by operating the potential of the plate line PL (second line) at the time of the restart of the voltage application to the bit line BL (first line) after verify operation is carried out by the sense amplifier SA.

The embodiments of the present invention are not limited to a resistive memory of the type in which the insulating property of an insulating film is controlled by metal ions, but can be applied to any resistive memory.

The correspondence between the configurations of FIG. 5 and FIG. 9 and the "first drive controller" and the "second drive controller" of the present embodiment will be described below.

The first drive controller is the controller for direct verify operation, and therefore includes the switches S1, S2, and Sv in FIG. 5, three power supplies controlled by these switches, the. BL driver BLdrv, the sense amplifier SA, the switch S4 for the reference potential of the sense amplifier SA, and three power supplies for the reference potential. On the other hand, the second drive controller includes the switch S3 and the power supply for the discharge potential Vdischarge.

In the configuration of FIG. 9, according to comparison with the configuration of FIG. 5, the power supply for the discharge potential Vdischarge does not exist, while the PL driver PLdrv for switching between the common potential Vcommon and the erasing voltage Verase is provided. Furthermore, the switch S3 is provided as the switch for switching among the output of the PL driver and the outputs of two PL power supplies as the voltage given to the plate line PL.

The switch S3 and the PL driver PLdrv having such a function are the configuration included in both of the "first drive controller" and the "second drive controller." Furthermore, the output of the PL driver PLdrv carries out the polarity reversal of the inter-line voltage by the data held by the sense amplifier SA. Therefore, the sense amplifier SA is also the configuration included in both of the "first drive controller" and the "second drive controller." The correspondence relationship between the other part in the configuration of FIG. 9 and the "first drive controller" and the "second drive controller" is the same as that of the configuration of FIG. 5.

The present application contains subject matter related to that disclosed in Japanese Priority Patent Application JP 2009-176848 filed in the Japan Patent Office on Jul. 29, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A resistive memory device comprising:
    a storage element configured to have a data storage state changing based on resistance change dependent on an application voltage;
    a first line and a second line configured to supply the application voltage to the storage element;
    a first drive controller configured to control direct verify operation of making an element current flow through the storage element by stopping voltage supply to the first line after performing writing or erasing of data for the storage element; and
    a second drive controller configured to reverse polarity of an inter-line voltage between the first line and the second line to polarity different from polarity at the time of latest voltage supply to the first line by potential operation of one of the first line and the second line before stop of voltage supply to the first line by the first drive controller or since end of a discharge period of the first line by the element current in direct verify operation of one of the writing and the erasing, the second drive controller not carrying out polarity reversal of the inter-line voltage in direct verify operation of the other of the writing and the erasing.

2. The resistive memory device according to claim 1, wherein
    the second drive controller carries out polarity reversal of the inter-line voltage by changing potential of the first line to such a potential that potential relationship with potential of the second line is reversed before stop of voltage supply to the first line in direct verify operation of one of the writing and the erasing.

3. The resistive memory device according to claim 2, wherein
    the second drive controller has a discharge part that changes the potential of the first line to a potential lower than a potential basis used in application of a high-level voltage to the first line in the writing and the erasing, and the second drive controller carries out polarity reversal of the inter-line voltage before stop of voltage supply to the first line by controlling the discharge part.

4. The resistive memory device according to claim 1, wherein
    a sense amplifier that detects potential change occurring at the first line depending on the element current is provided, and
    the second drive controller carries out polarity reversal of the inter-line voltage by operating potential of the second line at the time of activation of the sense amplifier in direct verify operation of one of the writing and the erasing.

5. The resistive memory device according to claim 1, wherein
    a sense amplifier that detects potential change occurring at the first line depending on the element current is provided, and
    the second drive controller carries out polarity reversal of the inter-line voltage by operating potential of the second line at the time of restart of voltage application to the first line after detection of potential change by the sense amplifier in direct verify operation of one of the writing and the erasing.

6. The resistive memory device according to claim 1, wherein
    a memory cell array in which the storage elements are arranged in a matrix is provided,
    a plurality of the first lines and a plurality of the second lines are disposed separately for each of cell rows or cell columns of the memory cell array, and
    the second drive controller carries out inhibit setting for a memory cell whose resistance change is sufficient by drive control in which polarity reversal of the inter-line voltage is carried out in operation of one of the writing and the erasing and polarity reversal of the inter-line voltage is not carried out in operation of the other.

7. An operating method of a resistive memory device, comprising the steps of:

carrying out memory operation of performing writing or erasing of data depending on polarity of an inter-line voltage between a first line and a second line for a storage element whose data storage state changes based on resistance change dependent on an application voltage; and stopping supply of the inter-line voltage on a side of the first line at end of the memory operation to discharge the first line by an inter-line voltage at the time of the stop, and reading out magnitude of an element current flowing through the storage element at the time of the discharge based on potential change of the first line, wherein the step of stopping supply includes the sub-step of reversing polarity of the inter-line voltage between the first line and the second line to polarity different from polarity at the time of latest voltage supply to the first line by potential operation of one of the first line and the second line before stop of voltage supply to the first line or since end of a discharge period of the first line by the element current, and the sub-step of reversing polarity is carried out in the step of stopping supply after one of the writing and the erasing, and the sub-step of reversing polarity is not carried out in the step of stopping supply after the other of the writing and the erasing.

\* \* \* \* \*